US012727285B2

(12) United States Patent
Liu et al.

(10) Patent No.: US 12,727,285 B2
(45) Date of Patent: Sep. 1, 2026

(54) MULTI-WAVELENGTH LED STRUCTURES AND MANUFACTURING METHODS THEREOF

(71) Applicant: ENKRIS SEMICONDUCTOR, INC., Suzhou (CN)

(72) Inventors: Weihua Liu, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 578 days.

(21) Appl. No.: 18/025,321

(22) PCT Filed: Nov. 24, 2020

(86) PCT No.: PCT/CN2020/131193

§ 371 (c)(1),
(2) Date: Mar. 8, 2023

(87) PCT Pub. No.: WO2022/109797

PCT Pub. Date: Jun. 2, 2022

(65) Prior Publication Data

US 2023/0335672 A1 Oct. 19, 2023

(51) Int. Cl.
*H10H 20/815* (2025.01)
*H10H 20/01* (2025.01)
(Continued)

(52) U.S. Cl.
CPC ...... *H10H 20/815* (2025.01); *H10H 20/0137* (2025.01); *H10H 20/812* (2025.01); *H10H 20/821* (2025.01); *H10H 20/825* (2025.01)

(58) Field of Classification Search
CPC .......................... H10H 20/8252; H10H 20/812
See application file for complete search history.

(56) References Cited

U.S. PATENT DOCUMENTS 5,801,071 A 9/1998 Takahashi
8,698,163 B2 4/2014 Ting
(Continued)

FOREIGN PATENT DOCUMENTS

CN 103460409 A 12/2013
CN 105870286 * 8/2016 ............. H01L 33/32
(Continued)

OTHER PUBLICATIONS

ISA State Intellectual Property Office of the People's Republic of China, International Search Report Issued in Application No. PCT/CN2020/131193, Jun. 24, 2021, WIPO, 4 pages.
(Continued)

*Primary Examiner* — Jesse Y Miyoshi
(74) *Attorney, Agent, or Firm* — BSJ & SUN LLC

(57) ABSTRACT

A multi-wavelength LED structure (1, 2, 3, 4, 5, 6, 7, 8) and a manufacturing method therefor. The multi-wavelength LED structure (1, 2, 3, 4, 5, 6, 7, 8) comprises: a first semiconductor layer (11), a stress release layer (12) having a V-shaped pit (12*a*), a first quantum well layer (131) and a second quantum well layer (132), which are stacked, from bottom to top, on a side wall of the V-shaped pit (12*a*) and a top wall of the stress release layer (12), and a second semiconductor layer (14) that is located on the second quantum well layer (132), wherein the conduction type of the second semiconductor layer (14) is the opposite of that of the first semiconductor layer (11).

12 Claims, 8 Drawing Sheets

(51) Int. Cl.

| | |
|---|---|
| ***H10H 20/812*** | (2025.01) |
| ***H10H 20/821*** | (2025.01) |
| ***H10H 20/825*** | (2025.01) |

(56) References Cited

U.S. PATENT DOCUMENTS

| | | | | |
|---|---|---|---|---|
| 8,828,752 | B2 | 9/2014 | Ting | |
| 9,490,392 | B2 | 11/2016 | Ting | |
| 10,056,524 | B2 | 8/2018 | Togawa et al. | |
| 2013/0082273 | A1 | 4/2013 | Ting | |
| 2014/0106493 | A1 | 4/2014 | Ting | |
| 2014/0110720 | A1* | 4/2014 | Choi | H10H 20/8252 257/76 |
| 2015/0024531 | A1 | 1/2015 | Ting | |
| 2016/0043275 | A1 | 2/2016 | Ting | |
| 2016/0276529 | A1 | 9/2016 | Ma et al. | |
| 2017/0092807 | A1* | 3/2017 | Okuno | H10H 20/816 |
| 2017/0317232 | A1 | 11/2017 | Togawa et al. | |

FOREIGN PATENT DOCUMENTS

| | | | |
|---|---|---|---|
| CN | 105870286 | A | 8/2016 |
| CN | 106711300 | A | 5/2017 |
| CN | 107004743 | A | 8/2017 |
| CN | 109192834 | A | 1/2019 |
| CN | 107742665 | B | 5/2019 |
| CN | 109980056 | A | 7/2019 |
| EP | 2226854 | A1 | 9/2010 |
| EP | 2396818 | A2 | 12/2011 |
| JP | 2016178267 | A | 10/2016 |

OTHER PUBLICATIONS

ISA State Intellectual Property Office of the People's Republic of China, Written Opinion of the International Searching Authority Issued in Application No. PCT/CN2020/131193, Jun. 24, 2021, WIPO, 6 pages. (Submitted with Machine/Partial Translation).

State Intellectual Property Office of the People's Republic of China, Office Action and Search Report Issued in Application No. 2020801062865, Feb. 8, 2025, 18 pages. (Submitted with Machine Translation).

Zhang Yun-Yan et al, "Theoretical study of GaN interval layers and quantum well barrier layers of different doping types in dual-wavelength LED", Acta Phys. Sin. vol. 60, No. 1 (2011) 018502, 6 pages. (Submitted with Abstract Translation).

* cited by examiner

Provide a first semiconductor layer, and epitaxially grow a stress release layer on the first semiconductor layer, where the stress release layer is provided with a V-shaped pit

S1

Successively epitaxially grow a first quantum well layer and a second quantum well layer on a side wall of the V-shaped pit and a top wall of the stress release layer; where the second quantum well layer located on the top wall of the stress release layer is a first light-emitting region, the first quantum well layer located on the top wall of the stress release layer is a second light-emitting region, and the first quantum well layer or the second quantum well layer located on the side wall of the V-shaped pit is a third light-emitting region

S2

Epitaxially grow a second semiconductor layer on the second quantum well layer, where a conductive type of the second semiconductor layer is opposite to a conductive type of the first semiconductor layer; if electron-hole pairs of the second semiconductor layer and the first semiconductor layer are recombined in the first light-emitting region, light corresponding to a first light-emitting wavelength is emit; if electron-hole pairs of the second semiconductor layer and the first semiconductor layer are recombined in the second light-emitting region, light corresponding to a second light-emitting wavelength is emit; if electronic-hole pairs of the second semiconductor layer and the first semiconductor layer are recombined in the third light-emitting region through the side wall of the V-shaped pit, light corresponding to a third light-emitting wavelength is emit; and the first light-emitting wavelength, the second light-emitting wavelength and the third light-emitting wavelength correspond to different colors of lights

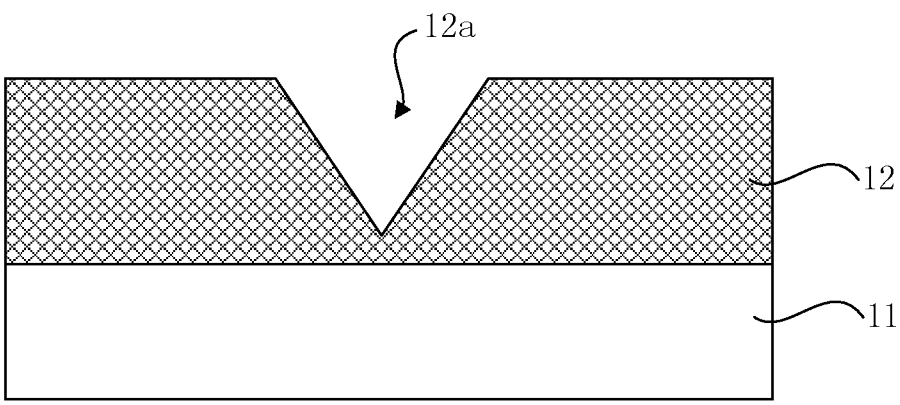

FIG. 3

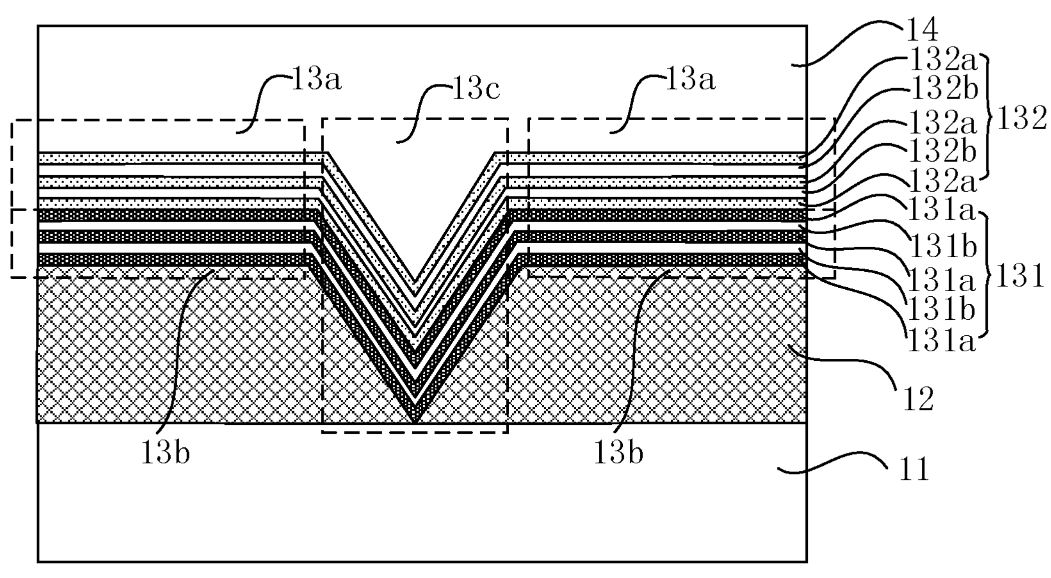
FIG. 4
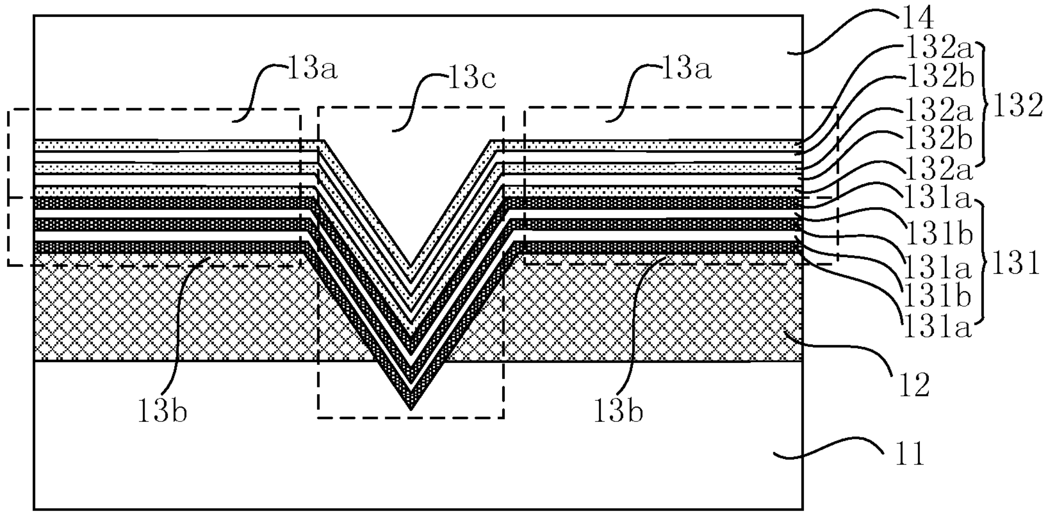
FIG. 5

MULTI-WAVELENGTH LED STRUCTURES AND MANUFACTURING METHODS THEREOF

CROSS REFERENCE TO RELATED APPLICATIONS

This application is a US National Phase of a PCT Application No. PCT/CN2020/131193 filed on Nov. 24, 2020, the entire contents of which are incorporated herein by reference in their entireties.

TECHNICAL FIELD

The present disclosure relates to the field of semiconductor technology, in particular to multi-wavelength LED structures and manufacturing methods thereof.

BACKGROUND

Light-emitting diodes (LEDs for short) radiate visible light through the recombination of electrons and holes. The two main applications of LEDs include lighting and display. Especially in the display field, future development trends include: longer life, higher image quality and higher definition (more pixels and pixels of smaller sizes). The key technology to realize high-definition display is to realize ultra-small light-emitting pixels, which requires full-color LED light-emitting units of smaller sizes.

In the prior art, on the one hand, a size of a full-color LED packaging unit is 1 mm*1 mm, in which the red, green and blue LED chips are packaged on the PCB board through die bond and wire bond, and then through the conductive through-hole process, the electrodes of the three chips are leaded from the back of the PCB (Printed Circuit Board), to form a full-color LED packaging unit. The full-color LED packaging unit is then bonded to the COB (chip on board) board through the COB packaging process, and the dot matrix LED display screen is formed through wiring rows and columns on the COB board. The full-color LED packaging unit and dot matrix LED display are both large in size and high in cost.

On the other hand, the light-emitting layer in LED is realized by wavelength conversion using phosphor or quantum dots, for example, the light-emitting layer in LED is realized by applying red phosphor and green phosphor on blue LED; or by applying blue phosphor, green phosphor and red phosphor on ultraviolet LED. The disadvantage of this method is that the phosphor or quantum dot has short life and reliability problems. Therefore, there is a need for an LED structure that can solve the problem of the complex driving circuit of multi-wavelength LED and the blue light hazard of ultraviolet LED with blue, green and red phosphor, and at the same time, the color rendering of which is good and the luminous wavelength of which can be adjusted freely.

SUMMARY

The present disclosure aims to provide multi-wavelength LED structures and manufacturing methods.

To achieve the above purpose, a first aspect of the present disclosure provides a multi-wavelength LED structure, including:

a first semiconductor layer; a stress release layer located on the first semiconductor layer, where the stress release layer is provided with a V-shaped pit;

a first quantum well layer and a second quantum well layer stacked from bottom to top on a side wall of the V-shaped pit and a top wall of the stress release layer; where the second quantum well layer located on the top wall of the stress release layer is a first light-emitting region, the first quantum well layer located on the top wall of the stress release layer is a second light-emitting region, and the first quantum well layer or the second quantum well layer located on the side wall of the V-shaped pit is a third light-emitting region; and a second semiconductor layer located on the second quantum well layer, where a conductive type of the second semiconductor layer is opposite to a conductive type of the first semiconductor layer; if electron-hole pairs of the second semiconductor layer and the first semiconductor layer recombine in the first light-emitting region, light corresponding to a first light-emitting wavelength emits; if electron-hole pairs of the second semiconductor layer and the first semiconductor layer recombine in the second light-emitting region, light is corresponding to a second light-emitting wavelength emits; if electronic-hole pairs of the second semiconductor layer and the first semiconductor layer recombine in the third light-emitting region through the side wall of the V-shaped pit, light corresponding to a third light-emitting wavelength emits; and the first light-emitting wavelength, the second light-emitting wavelength and the third light-emitting wavelength correspond to different colors of lights.

In some embodiments, the V-shaped pit penetrates part or all of a thickness of the stress release layer, or the V-shaped pit further partially penetrates the first semiconductor layer.

In some embodiments, the first quantum well layer is a multiple quantum well layer, and/or the second quantum well layer is a multiple quantum well layer.

In some embodiments, a conductivity type of the first semiconductor layer is N-type, and a conductivity type of the second semiconductor layer is P-type; and the second quantum well layer includes a second well layer, second barrier layers arranged on both sides of the second well layer, and a second anti-annihilation layer arranged between the second barrier layer adjacent to the second semiconductor layer and the second well layer, and a conduction band energy level of the second anti-annihilation layer is higher than a conduction band energy level of the second barrier layer, and/or the first quantum well layer includes a first well layer, first barrier layers arranged on both sides of the first well layer, and a first anti-annihilation layer arranged between the first barrier layer adjacent to the second quantum well layer and the first well layer, and a conduction band energy level of the first anti-annihilation layer is higher than a conduction band energy level of the first barrier layer.

In some embodiments, a third anti-annihilation layer is arranged between the first quantum well layer and the second quantum well layer, and a conduction band energy level of the third anti-annihilation layer is higher than a conduction band energy level of the second barrier layer.

In some embodiments, a conductivity type of the first semiconductor layer is P-type, and a conductivity type of the second semiconductor layer is N-type; and the first quantum well layer includes a first well layer, first barrier layers arranged on both sides of the first well layer, and a first anti-annihilation layer arranged between the first barrier layer adjacent to the stress release layer and the first well layer, and a conduction band energy level of the first anti-annihilation layer is higher than a conduction band energy level of the first barrier layer, and/or the second quantum well layer includes a second well layer, second barrier layers arranged on both sides of the second well layer, and a second anti-annihilation layer arranged between the second barrier layer adjacent to the first quantum well layer and the second well layer, and a conduction band energy level of the second anti-annihilation layer is higher than a conduction band energy level of the second barrier layer.

In some embodiments, a third anti-annihilation layer is arranged between the first quantum well layer and the second quantum well layer, and a conduction band energy level of the third anti-annihilation layer is higher than a conduction band energy level of the first barrier layer.

In some embodiments, the first anti-annihilation layer contacts the first well layer, or a first interlayer is arranged between the first anti-annihilation layer and the first well layer; and the second anti-annihilation layer contacts the second well layer, or a second interlayer is arranged between the second anti-annihilation layer and the second well layer.

In some embodiments, the first anti-annihilation layer contains Al element, and from the first barrier layer to the first well layer, a proportion of an amount of Al element in the first anti-annihilation layer gradually increases; or the second anti-annihilation layer contains Al element, and from the second barrier layer to the second well layer, a proportion of an amount of Al element in the second anti-annihilation layer gradually increases.

In some embodiments, from the first barrier layer to the first well layer, the proportion of the amount of Al element in the first anti-annihilation layer continuously increases or increases stepwise; or from the second barrier layer to the second well layer, the proportion of the amount of Al element in the second anti-annihilation layer continuously increases or increases stepwise.

A second aspect of the present disclosure provides a manufacturing method of a multi-wavelength LED structure, including:

- epitaxially growing a stress release layer on the first semiconductor layer, where the stress release layer is provided with a V-shaped pit;
- successively epitaxially growing a first quantum well layer and a second quantum well layer on a side wall of the V-shaped pit and a top wall of the stress release layer; where the second quantum well layer located on the top wall of the stress release layer is a first light-emitting region, the first quantum well layer located on the top wall of the stress release layer is a second light-emitting region, and the first quantum well layer or the second quantum well layer located on the side wall of the V-shaped pit is a third light-emitting region; and
- epitaxially growing a second semiconductor layer on the second quantum well layer, where a conductive type of the second semiconductor layer is opposite to a conductive type of the first semiconductor layer; if electron-hole pairs of the second semiconductor layer and the first semiconductor layer recombine in the first light-emitting region, light corresponding to a first light-emitting wavelength emits; if electron-hole pairs of the second semiconductor layer and the first semiconductor layer recombine in the second light-emitting region, light is corresponding to a second light-emitting wavelength emits; if electronic-hole pairs of the second semiconductor layer and the first semiconductor layer recombine in the third light-emitting region through the side wall of the V-shaped pit, light corresponding to a third light-emitting wavelength emits; and the first light-emitting wavelength, the second light-emitting wavelength and the third light-emitting wavelength correspond to different colors of lights.

In some embodiments, the V-shaped pit penetrates part or all of a thickness of the stress release layer, or the V-shaped pit further partially penetrates the first semiconductor layer.

In some embodiments, the V-shaped pit is formed during a process of epitaxially growing the stress release layer, or the V-shaped pit is formed by etching the stress release layer.

In some embodiments, the first quantum well layer is a multiple quantum well layer, and/or the second quantum well layer is a multiple quantum well layer.

In some embodiments, a conductivity type of the first semiconductor layer is N-type, and a conductivity type of the second semiconductor layer is P-type; and the second quantum well layer includes a second well layer, second barrier layers arranged on both sides of the second well layer, and a second anti-annihilation layer arranged between the second barrier layer adjacent to the second semiconductor layer and the second well layer, and a conduction band energy level of the second anti-annihilation layer is higher than a conduction band energy level of the second barrier layer, and/or the first quantum well layer includes a first well layer, first barrier layers arranged on both sides of the first well layer, and a first anti-annihilation layer arranged between the first barrier layer adjacent to the second quantum well layer and the first well layer, and a conduction band energy level of the first anti-annihilation layer is higher than a conduction band energy level of the first barrier layer.

In some embodiments, a third anti-annihilation layer is arranged between the first quantum well layer and the second quantum well layer, and a conduction band energy level of the third anti-annihilation layer is higher than a conduction band energy level of the second barrier layer.

In some embodiments, a conductivity type of the first semiconductor layer is P-type, and a conductivity type of the second semiconductor layer is N-type; and the first quantum well layer includes a first well layer, first barrier layers arranged on both sides of the first well layer, and a first anti-annihilation layer arranged between the first barrier layer adjacent to the stress release layer and the first well layer, and a conduction band energy level of the first anti-annihilation layer is higher than a conduction band energy level of the first barrier layer, and/or the second quantum well layer includes a second well layer, second barrier layers arranged on both sides of the second well layer, and a second anti-annihilation layer arranged between the second barrier layer adjacent to the first quantum well layer and the second well layer, and a conduction band energy level of the second anti-annihilation layer is higher than a conduction band energy level of the second barrier layer.

In some embodiments, a third anti-annihilation layer is arranged between the first quantum well layer and the second quantum well layer, and a conduction band energy level of the third anti-annihilation layer is higher than a conduction band energy level of the second barrier layer.

In some embodiments, the first anti-annihilation layer contacts the first well layer, or a first interlayer is arranged between the first anti-annihilation layer and the first well layer; and the second anti-annihilation layer contacts the second well layer, or a second interlayer is arranged between the second anti-annihilation layer and the second well layer.

In some embodiments, the first anti-annihilation layer contains Al element, and from the first barrier layer to the first well layer, a proportion of an amount of Al element in the first anti-annihilation layer gradually increases; or the second anti-annihilation layer contains Al element, and from the second barrier layer to the second well layer, a proportion of an amount of Al element in the second anti-annihilation layer gradually increases.

In some embodiments, from the first barrier layer to the first well layer, the proportion of the amount of Al element in the first anti-annihilation layer continuously increases or increases stepwise; or from the second barrier layer to the second well layer, the proportion of the amount of Al element in the second anti-annihilation layer continuously increases or increases stepwise.

BRIEF DESCRIPTION OF THE DRAWINGS

FIG. 2 is a flowchart of a manufacturing method of the multi-wavelength LED structure in FIG. 1.

FIG. 3 is a schematic diagram of an intermediate structure corresponding to a process in FIG. 2.

FIG. 4 is a sectional structure diagram of a multi-wavelength LED structure according to a second embodiment of the present disclosure.

FIG. 5 is a sectional structure diagram of a multi-wavelength LED structure according to a third embodiment of the present disclosure.

Figure 1:
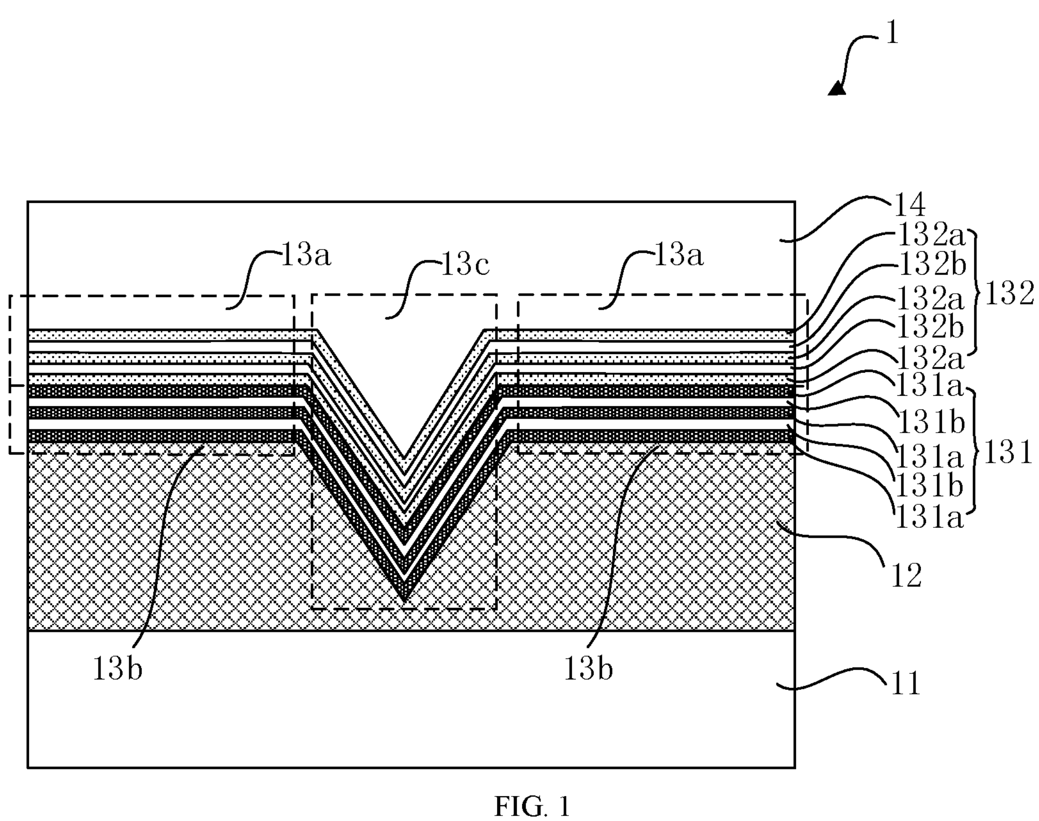
FIG. 1 is a sectional structure diagram of a multi-wavelength LED structure according to a first embodiment of the present disclosure.

For the convenience of understanding the present disclosure, all reference numerals appearing in the present disclosure are listed below.

| | |
|---|---|
| first semiconductor layer 11 | stress release layer 12 |
| V-shaped pit 12a | first quantum well layer 131 |
| second quantum well layer 132 | first light-emitting region 13a |
| second light-emitting region 13b | third light-emitting region 13c |
| first barrier layer 131a | first well layer 131b |
| first anti-annihilation layer 131c | first interlayer 131d |
| second barrier layer 132a | second well layer 132b |
| second anti-annihilation layer 132c | second interlayer 132d |
| third anti-annihilation layer 133 | second semiconductor layer 14 |

multi-wavelength LED structures 1, 2, 3, 4, 5, 6, 7 and 8

DETAILED DESCRIPTION OF THE EMBODIMENTS

In order to make the above-mentioned objects, features and advantages of the present disclosure more obvious and understandable, embodiments of the present disclosure will be described in detail below with reference to the accompanying drawings.

FIG. 1 is a sectional structure diagram of a multi-wavelength LED structure according to a first embodiment of the present disclosure.

As shown in FIG. 1, a multi-wavelength LED structure 1 includes:

- a first semiconductor layer 11 and a stress release layer 12 located on the first semiconductor layer 11, where the stress release layer 12 includes a V-shaped pit 12*a* (shown in FIG. 3).
- a first quantum well layer 131 and a second quantum well layer 132 stacked on a side wall of the V-shaped pit 12*a* and a top wall of the stress release layer 12 from bottom to top, where the second quantum well layer 132 located on a top wall of the stress release layer is a first light-emitting region 13*a*, the first quantum well layer 131 located on the top wall of the stress release layer is a second light-emitting region 13*b*, and the first quantum well layer 131 or the second quantum well layer 132 located on the side wall of the V-shaped pit is a third light-emitting region 13*c*; and
- a second semiconductor layer 14 located on the second quantum well layer 132, where a conductive type of the second semiconductor layer 14 is opposite to a conductive type of the first semiconductor layer 11; if electron-hole pairs of the second semiconductor layer 14 and the first semiconductor layer 11 recombine in the first light-emitting region 13*a*, light corresponding to a first light-emitting wavelength emits; if electron-hole pairs of the second semiconductor layer 14 and the first semiconductor layer 11 recombine in the second light-emitting region 13*b*, light corresponding to a second light-emitting wavelength emits; if electron-holes of the second semiconductor layer 14 and the first semiconductor layer 11 recombine on the side wall of the V-shaped pit 12*a* in the third light-emitting region 13*c*, light corresponding to a third light-emitting wavelength emits; and the first light-emitting wavelength, the second light-emitting wavelength and the third light-emitting wavelength correspond to different colors of lights.

Materials of the first semiconductor layer 11, the stress release layer 12 and the second semiconductor layer 14 can all include III-V compounds, for example, materials of the first semiconductor layer 11 and the second semiconductor layer 14 can include GaN, and the stress release layer 12 can be a single-layer or multi-layer structure, for example, a material of the single-layer structure is InGaN, and the multi-layer structure is an alternate distribution of InGaN layer and GaN layer.

In this embodiment, the first semiconductor layer 11 can be an N-type semiconductor layer to provide electrons to the first quantum well layer 131 and the second quantum well layer 132. N-type doping ions in the N-type semiconductor layer can include at least one of Si ions, Ge ions, Sn ions, Se ions or Te ions.

In the embodiment, the stress release layer 12 can be doped with N-type ions to conduct electricity in N-type.

The second semiconductor layer 14 can be a P-type semiconductor layer to provide holes to the first quantum well layer 131 and the second quantum well layer 132. P-type doping ions in the P-type semiconductor layer can include at least one of Mg ions, Zn ions, Ca ions, Sr ions or Ba ions.

The first quantum well layer 131 includes a first well layer 131*b* and first barrier layers 131*a* arranged on both sides of the first well layer 131*b*. The first barrier layers 131*a* and the first well layers 131*b* can form a stacked structure by stacking alternately. A band gap width of the first barrier layer 131*a* is greater than a band gap width of the first well layer 131*b*. For example, a material of the first barrier layer 131*a* is $In_xGa_{1-x}N$, and a material of the first well layer 131*b* is $In_yGa_{1-y}N$, $x<y$; or a material of the first barrier layer 131*a* is GaN, and a material of the first well layer 131*b* is InGaN. The first barrier layer 131*a* can be doped with N-type ions, or not be doped.

The band gap width of $In_xGa_{1-x}N$ material changes with the change of the ratio (proportion of amount) of In (Indium) component. From 0.7 eV of the band gap of InN to 3.4 eV of the band gap of GaN, corresponding wavelengths of emitted lights can cover the whole visible light spectrum, so the multi-wavelength emitting light from red light to blue light can be realized through $In_xGa_{1-x}N$ material.

The first quantum well layer 131 can be a single quantum well (SQW) structure or a multiple quantum well (MQW) structure. In the multiple quantum well structure, components of each first barrier layer 131*a* can be the same, to correspond to the same band gap width, and components of each first well layer 131*b* can also be the same to correspond to the same band gap width.

The second quantum well layer 132 includes a second well layer 132*b* and second barrier layers 132*a* arranged on both sides of the first well layer 131*b*. The second barrier layers 132*a* and the second well layers 132*b* can form a stacked structure by stacking alternately. A band gap width of the second barrier layer 132*a* is greater than a band gap width of the second well layer 132*b*. For example, a material of the second barrier layer 132*a* is $In_5Ga_{1-5}N$, and a material of the second well layer 132*b* is $In_tGa_{1-t}N$, $s<t$; or a material of the second barrier layer 132*a* is GaN, and a material of the second well layer 132*b* is InGaN. The second barrier layer 132*a* can be doped with N-type ions, or not be doped.

The second quantum well layer 132 can be a single quantum well (SQW) structure or a multiple quantum well (MQW) structure. In the multiple quantum well structure, components of each second barrier layer 132*a* can be the same, to correspond to the same band gap width, and components of each second well layer 132*b* can also be the same to correspond to the same band gap width.

In the embodiment, the proportion of the amount of In element in the second quantum well layer 132 can be greater than the proportion of the amount of In element in the first quantum well layer 131, so that the emitting-light wavelength of the first light-emitting region 13*a* is greater than the emitting-light wavelength of the second light-emitting region 13*b*.

In the embodiment, as shown in FIG. 1, the V-shaped pit 12*a* penetrates part of the thickness of the stress release layer 12. The thickness of the second quantum well layer 132 located on the side wall of the V-shaped pit is less than the thickness of the second quantum well layer 132 located on the top wall. The thickness of the second barrier layer 132*a* or second well layer 132*b* on the top wall can be in the order of magnitude of micrometers, and the thickness of the second barrier layer 132*a* or second well layer 132*b* on the side wall of the V-shaped pit can be in the order of magnitude of nanometers. If the thickness of the second quantum well layer 132 is small, the corresponding band gap width is large, and the emitting-light wavelength is short, and thus, the emitting-light wavelength of the second quantum well layer 132 located in the third light-emitting region 13*c* is smaller than the emitting-light wavelength of the second quantum well layer 132 located in the first light-emitting region 13*a*.

The thickness of the first quantum well layer 131 located on the side wall of the V-shaped pit is less than the thickness of the first quantum well layer 131 located on the top wall. The thickness of the first barrier layer 131*a* or first well layer 131*b* on the top wall can be in the order of magnitude of micrometers, and the thickness of the first barrier layer 131*a* or first well layer 131*b* on the side wall of the V-shaped pit can be in the order of magnitude of nanometers. If the thickness of the first quantum well layer 131 is small, the corresponding band gap width is large, and the emitting-light wavelength is short, and thus, the emitting-light wavelength of the first quantum well layer 131 located in the third light-emitting region 13*c* is smaller than the emitting-light wavelength of the first quantum well layer 131 located in the second light-emitting region 13*b*.

In addition, research shows that the electron-hole pairs are easy to recombine in the quantum well layer close to the P-type semiconductor layer. In the embodiment, the electron-hole pairs are easy to recombine in the second quantum well layer 132. The light-emitting efficiency of the second quantum well layer 132 is higher than the light-emitting efficiency of the first quantum well layer 131. Therefore, the electron-hole pairs can be directly recombined in the second quantum well layer 132 located on the top wall without passing the side wall of the V-shaped pit 12*a*. Because the thickness of the quantum well layer on the side wall is less than the thickness of the corresponding quantum well layer on the top wall, the carrier is easy to tunnel in the quantum well layer on the side wall, which can improve the light-emitting efficiency of the quantum well layer near the N-type semiconductor layer. In the embodiment, the electron-hole pairs recombine in the first quantum well layer 131 on the top wall through the V-shaped pit 12*a*, which can improve the light-emitting efficiency of the second light-emitting region 13*b*.

In other embodiments, the first semiconductor layer 11 can also be a P-type semiconductor layer to provide holes to the first quantum well layer 131 and the second quantum well layer 132. The stress release layer 12 can be doped with P-type ions to conduct electricity in P-type. The second semiconductor layer 14 can be an N-type semiconductor layer to provide electrons to the first quantum well layer 131 and the second quantum well layer 132. The electron-hole pairs recombine in the second quantum well layer 132 located at the top wall passing the side wall of the V-shaped pit 12*a*, which can improve the light-emitting efficiency of the first light-emitting region 13*a*. Furthermore, the proportion of the amount of In element in the second quantum well layer 132 can be smaller than the proportion of the amount of In element in the first quantum well layer 131, so that the emitting-light wavelength of the first light-emitting region 13*a* is smaller than the emitting-light wavelength of the second light-emitting region 13*b*.

The first embodiment of the present disclosure further provides a manufacturing method of the multi-wavelength LED structure in FIG. 1. FIG. 2 is a flowchart of the manufacturing method. FIG. 3 is a schematic diagram of an intermediate structure corresponding to a process in FIG. 2.

First of all, referring to step S1 in FIG. 2 and as shown in FIG. 3, the stress release layer 12 is epitaxial grown on the first semiconductor layer 11, and the stress release layer 12 includes a V-shaped pit 12*a*.

The material of the first semiconductor layer 11 can include a III-V group compound, such as GaN.

In the embodiment, the first semiconductor layer 11 can be an N-type semiconductor layer. N-type doping ions in the N-type semiconductor layer can include at least one of Si ions, Ge ions, Sn ions, Se ions or Te ions.

The stress release layer 12 can be a single-layer or multi-layer structure, for example, a material of the single-layer structure is InGaN, and the multi-layer structure is an alternate distribution of InGaN layer and GaN layer.

In the embodiment, the stress release layer 12 can be doped with N-type ions to conduct electricity in N-type.

The epitaxial growth process of the stress release layer 12 may include: atomic layer deposition (ALD), chemical vapor deposition (CVD), molecular beam epitaxy (MBE), plasma enhanced chemical vapor deposition (PECVD), low pressure chemical vapor deposition (LPCVD), metal-organic chemical vapor deposition (MOCVD), or a combination thereof. N-type ions can be realized by in-situ doping.

In the embodiment, the V-shaped pit 12*a* can be formed when the stress release layer 12 is epitaxial grown by controlling the process conditions. For example, the epitaxial temperature is between 700 and 900° C., the epitaxial rate of the epitaxial material is between 0.1 um/h and 5 um/h, and the doping concentration of N-type ions is controlled between $1E17/cm^3$ and $1E19/cm^3$, to form a size-controllable V-shaped pit 12*a* on the upper surface of the epitaxial material. In the embodiment, as shown in FIG. 3, the V-shaped pit 12*a* penetrates part of the thickness of the stress release layer 12.

In other embodiments, the V-shaped pit 12*a* can also be formed by etching the stress release layer 12.

Next, with reference to step S2 in FIG. 2 and as shown in FIG. 1, the first quantum well layer 131 and the second quantum well layer 132 are successively epitaxial grown on the side wall of the V-shaped pit 12*a* and the top wall of the stress release layer 12; the second quantum well layer 132 located on the top wall of the stress release layer is the first light-emitting region 13*a*; the first quantum well layer 131 located on the top wall of the stress release layer is the second light-emitting region 13*b*; the first quantum well layer 131 or the second quantum well layer 132 located on the side wall of the V-shaped pit is the third light-emitting region 13*c*.

The first quantum well layer 131 includes a first barrier layer 131*a* and a first well layer 131*b*. The first barrier layers 131*a* and the first well layers 131*b* can form a stacked structure by stacking alternately. A band gap width of the first barrier layer 131*a* is greater than a band gap width of the first well layer 131*b*. For example, a material of the first barrier layer 131*a* is $In_xGa_{1-x}N$, and a material of the first well layer 131*b* is $In_yGa_{1-y}N$, x<y; or a material of the first barrier layer 131*a* is GaN, and a material of the first well layer 131*b* is InGaN. The first barrier layer 131*a* can be doped with N-type ions, or not be doped.

The first quantum well layer 131 can be a single quantum well (SQW) structure or a multiple quantum well (MQW) structure. In the multiple quantum well structure, components of each first barrier layer 131*a* can be the same, to correspond to the same band gap width, and components of each first well layer 131*b* can also be the same to correspond to the same band gap width.

The second quantum well layer 132 includes a second barrier layer 132*a* and a second well layer 132*b*. The second barrier layers 132*a* and the second well layers 132*b* can form a stacked structure by stacking alternately. A band gap width of the second barrier layer 132*a* is greater than a band gap width of the second well layer 132*b*. For example, a material of the second barrier layer 132*a* is $In_5Ga_{1-5}N$, and a material of the second well layer 132*b* is $In_tGa_{1-t}N$, s<t; Or a material of the second barrier layer 132*a* is GaN, and a material of the second well layer 132*b* is InGaN. The second barrier layer 132*a* can be doped with N-type ions, or not be doped.

The second quantum well layer 132 can be a single quantum well (SQW) structure or a multiple quantum well (MQW) structure. In the multiple quantum well structure, components of each second barrier layer 132*a* can be the same, to correspond to the same band gap width, and components of each second well layer 132*b* can also be the same to correspond to the same band gap width.

In the embodiment, the proportion of the amount of In element in the second quantum well layer 132 can be greater than the proportion of the amount of In element in the first quantum well layer 131, so that the emitting-light wavelength of the first light-emitting region 13*a* is greater than the emitting-light wavelength of the second light-emitting region 13*b*.

The epitaxial growth process of the first quantum well layer 131 and the second quantum well layer 132 can refer to the epitaxial growth process of the stress release layer 12.

In the embodiment, the proportion of the amount of In element in the second quantum well layer 132 can be greater than the proportion of the amount of In element in the first quantum well layer 131, so that the emitting-light wavelength of the first light-emitting region 13*a* is greater than the emitting-light wavelength of the second light-emitting region 13*b*.

Then, referring to step S3 in FIG. 2 and as shown in FIG. 1, a second semiconductor layer 14 is epitaxially grown on the second quantum well layer 132, where a conductive type of the second semiconductor layer 14 is opposite to a conductive type of the first semiconductor layer 11; if electron-hole pairs of the second semiconductor layer 14 and the first semiconductor layer 11 recombine in the first light-emitting region 13*a*, light corresponding to a first light-emitting wavelength emits; if electron-hole pairs of the second semiconductor layer 14 and the first semiconductor layer 11 recombine in the second light-emitting region 13*b*, light corresponding to a second light-emitting wavelength emits; if electron-holes of the second semiconductor layer 14 and the first semiconductor layer 11 recombine on the side wall of the V-shaped pit 12*a* in the third light-emitting region 13*c*, light corresponding to a third light-emitting wavelength emits; and the first light-emitting wavelength, the second light-emitting wavelength and the third light-emitting wavelength correspond to different colors of lights.

A material of the second semiconductor layer 14 can include a III-V compound, such as GaN. The second semiconductor layer 14 can be a P-type semiconductor layer to provide holes to the first quantum well layer 131 and the second quantum well layer 132. P-type doping ions in the P-type semiconductor layer can include at least one of Mg ions, Zn ions, Ca ions, Sr ions or Ba ions.

The epitaxial growth process of the second semiconductor layer 14 can refer to the epitaxial growth process of the stress release layer 12.

In other embodiments, the first semiconductor layer 11 can also be a P-type semiconductor layer to provide holes to the first quantum well layer 131 and the second quantum well layer 132. The stress release layer 12 can be doped with P-type ions to conduct electricity in P-type. The second semiconductor layer 14 can be an N-type semiconductor layer to provide electrons to the first quantum well layer 131 and the second quantum well layer 132. The proportion of the amount of In element in the second quantum well layer 132 can be smaller than the proportion of the amount of In element in the first quantum well layer 131, so that the emitting-light wavelength of the first light-emitting region 13*a* is smaller than the emitting-light wavelength of the second light-emitting region 13*b*.

FIG. 4 is a sectional structure diagram of a multi-wavelength LED structure according to a second embodiment of the present disclosure. As shown in FIG. 4, the multi-wavelength LED structure 2 and a manufacturing method thereof according to the second embodiment are roughly the same as the multi-wavelength LED structure 1 and the manufacturing method according to the first embodiment, except that the V-shaped pit 12*a* penetrates the entire thickness of the stress release layer 12.

FIG. 5 is a sectional structure diagram of a multi-wavelength LED structure according to an eighth embodiment of the present disclosure. As shown in FIG. 5, the multi-wavelength LED structure 3 and a manufacturing method thereof according to the third embodiment are roughly the same as the multi-wavelength LED structure 1 and the manufacturing method according to the first embodiment, except that the V-shaped pit 12*a* penetrates the entire thickness of the stress release layer 12 and partially penetrates the first semiconductor layer 11.

Figure 6:
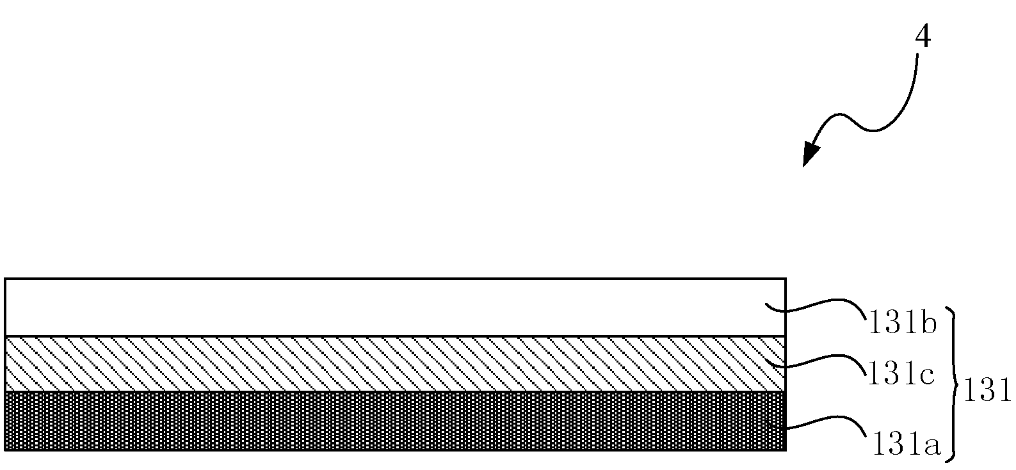
FIG. 6 is a sectional structure diagram of a local area of a multi-wavelength LED structure according to a fourth embodiment of the present disclosure.

FIG. 6 is a sectional structure diagram of a local area of a multi-wavelength LED structure according to a fourth embodiment of the present disclosure. As shown in FIG. 6, the multi-wavelength LED structure 4 and the manufacturing method thereof according to the fourth embodiment are roughly the same as the multi-wavelength LED structures 1, 2, 3 and the manufacturing methods thereof according to the first, second and third embodiment, except that the first semiconductor layer 11 has a conductivity type of N type, the second semiconductor layer 14 has a conductivity type of P type, and the first quantum well layer 131 further includes a first anti-annihilation layer 131*c*. The first anti-annihilation layer 131*c* is arranged between the first barrier layer 131*a* adjacent to the second quantum well layer 132 and the first well layer 131*b*. The conduction band energy level of the first anti-annihilation layer 131*c* is higher than the conduction band energy level of the first barrier layer 131*a*.

The conduction band energy level of the first anti-annihilation layer 131*c* is higher than the conduction band energy level of the first barrier layer 131*a*, which can reduce the probability of the electrons penetrating the last first barrier layer 131*a* on the electron transition path, thus improving the probability of the electrons recombining in the first quantum well layer 131, and improving the light-emitting efficiency of the first quantum well layer 131.

In other embodiments, the conductive type of the first semiconductor layer 11 can be P-type, and the conductive type of the second semiconductor layer 14 can be N-type. The first anti-annihilation layer 131*c* in the first quantum well layer 131 is arranged between the first barrier layer 131*a* adjacent to the first semiconductor layer 11 and the first well layer 131*b*. The conduction band energy level of the first anti-annihilation layer 131*c* is higher than the conduction band energy level of the first barrier layer 131*a*. The first anti-annihilation layer 131*c* can reduce the probability of the electrons penetrating the last first barrier layer 131*a* on the electron transition path, thus improving the probability of the electrons recombining in the first quantum well layer 131, and improving the light-emitting efficiency of the first quantum well layer 131.

Figure 7:
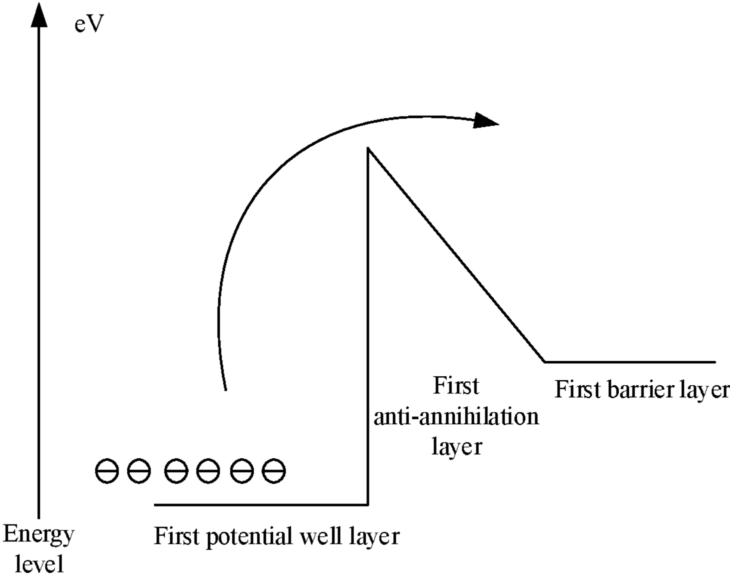
FIG. 7 is an energy level diagram of a first quantum well layer in FIG. 6.
Figure 8:
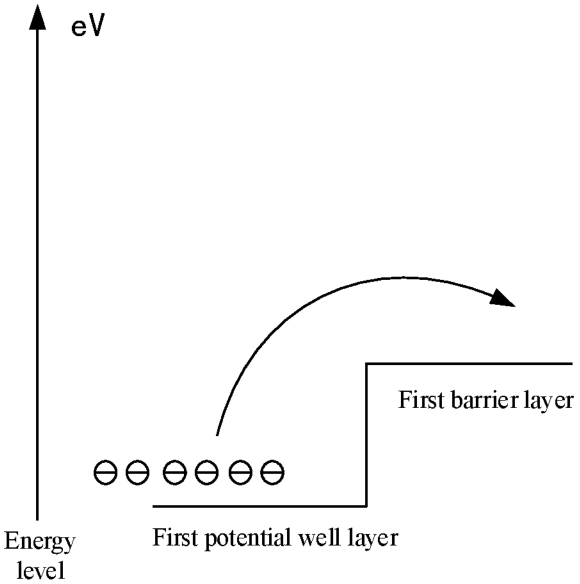
FIG. 8 is an energy level diagram of a first quantum well layer without a first anti-annihilation layer.

FIG. 7 is an energy level diagram of a first quantum well layer in FIG. 6. FIG. 8 is an energy level diagram of a first quantum well layer without a first anti-annihilation layer.

In FIG. 7, the first anti-annihilation layer 131*c* contacts the first well layer 131*b*, and the first anti-annihilation layer 131*c* contains Al (aluminum) element. From the first barrier layer 131*a* to the first well layer 131*b*, the proportion of the amount of Al in the first anti-annihilation layer 131*c* continuously increases.

The material of the first anti-annihilation layer 131*c* can be AlGaN, which can be doped with P-type ions, or not be doped. The band gap width of AlN is about 6.2 eV. Therefore, compared with FIG. 8, in FIG. 7, the higher the amount of the composition of Al, the higher the conduction band energy level of the first anti-annihilation layer 131*c*, the higher the conduction band energy level of the first barrier layer 131*a*, and the lower the probability of the electron penetrating the first barrier layer 131*a*.

Figure 9:
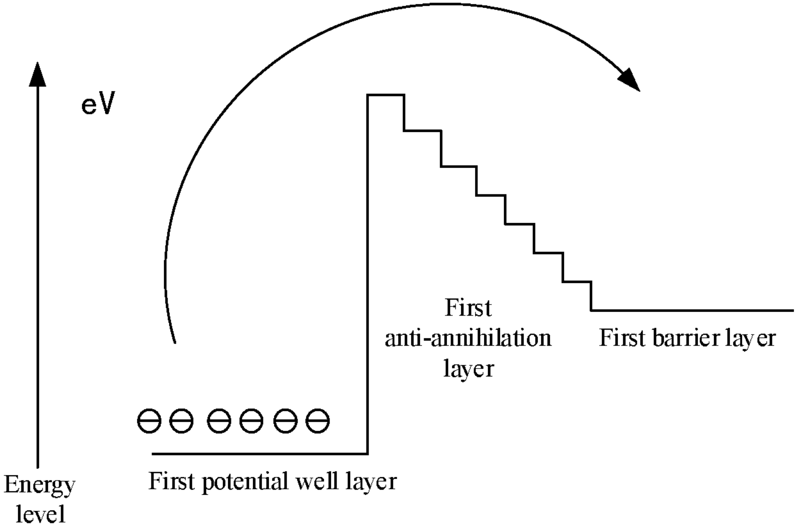
FIG. 9 is an energy level diagram of a first quantum well layer in FIG. 6.

FIG. 9 is an energy level diagram of a first quantum well layer in FIG. 6.

In FIG. 9, the first anti-annihilation layer 131*c* contacts the first well layer 131*b*, and the first anti-annihilation layer 131*c* contains Al element. From the first barrier layer 131*a* to the first well layer 131*b*, the proportion of the amount of Al in the first anti-annihilation layer 131*c* increases in a stepwise manner. Compared with FIG. 8, in FIG. 9, no matter how the amount of the composition of Al increases, the higher the amount of the composition of Al, the higher the conduction band energy level of the first anti-annihilation layer 131*c*, the higher the conduction band energy level of the first barrier layer 131*a*, and the lower the probability of the electron penetrating the first barrier layer 131*a*.

Figure 10:
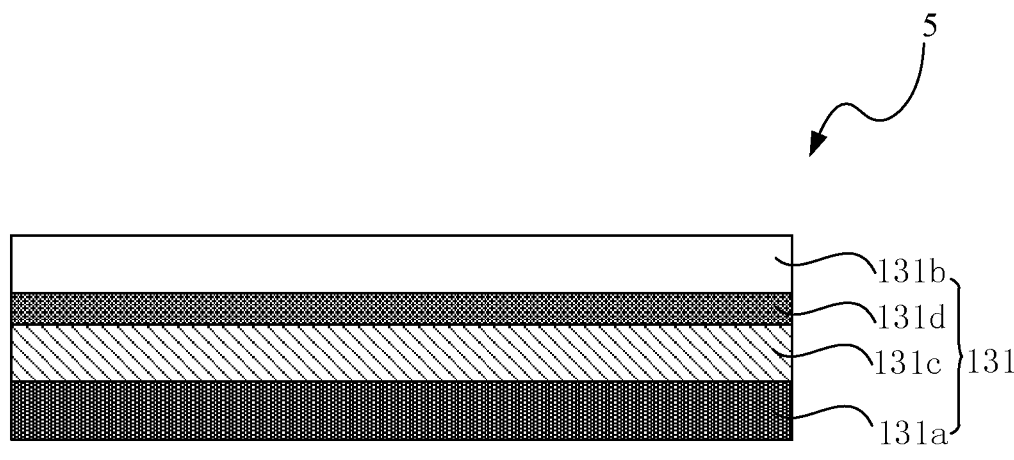
FIG. 10 is a sectional structure diagram of a local area of a multi-wavelength LED structure according to a fifth embodiment of the present disclosure.
Figure 11:
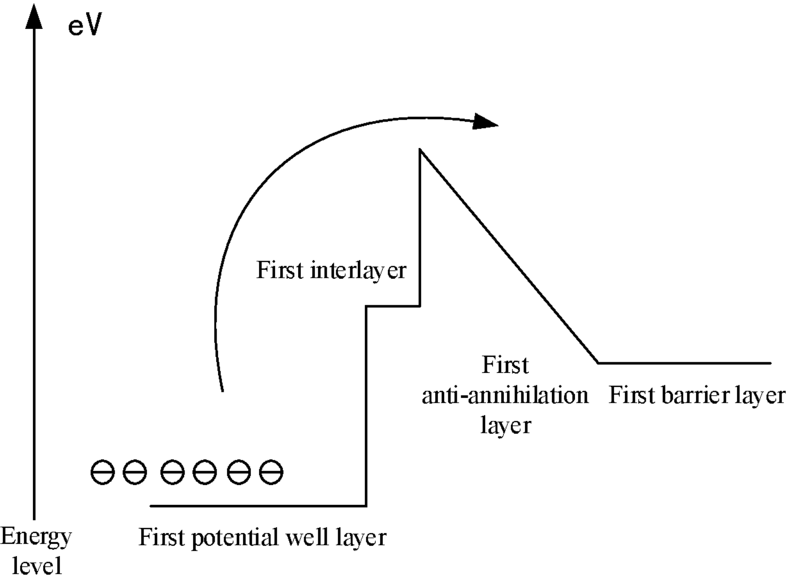
FIG. 11 is an energy level diagram of a first quantum well layer in FIG. 10.

FIG. 10 is a sectional structure diagram of a local area of a multi-wavelength LED structure according to a fifth embodiment of the present disclosure. FIG. 11 is an energy level diagram of a first quantum well layer in FIG. 10. Referring to FIG. 10 and FIG. 11, the multi-wavelength LED structure 5 and the manufacturing method thereof according to the fifth embodiment are roughly the same as the multi-wavelength LED structure 4 and the manufacturing method thereof according to the fourth embodiment, except that there is a first interlayer 131*d* between the first anti-annihilation layer 131*c* and the first well layer 131*b*. The proportion of the amount of Al in the first interlayer 131*d* is smaller than the proportion of the amount of Al in the first anti-annihilation layer 131*c*.

A material of the first interlayer 131*d* may be AlGaN. The thickness of the first interlayer 131*d* on the top wall can be in the order of magnitude of nanometers.

Figures 12, 13:
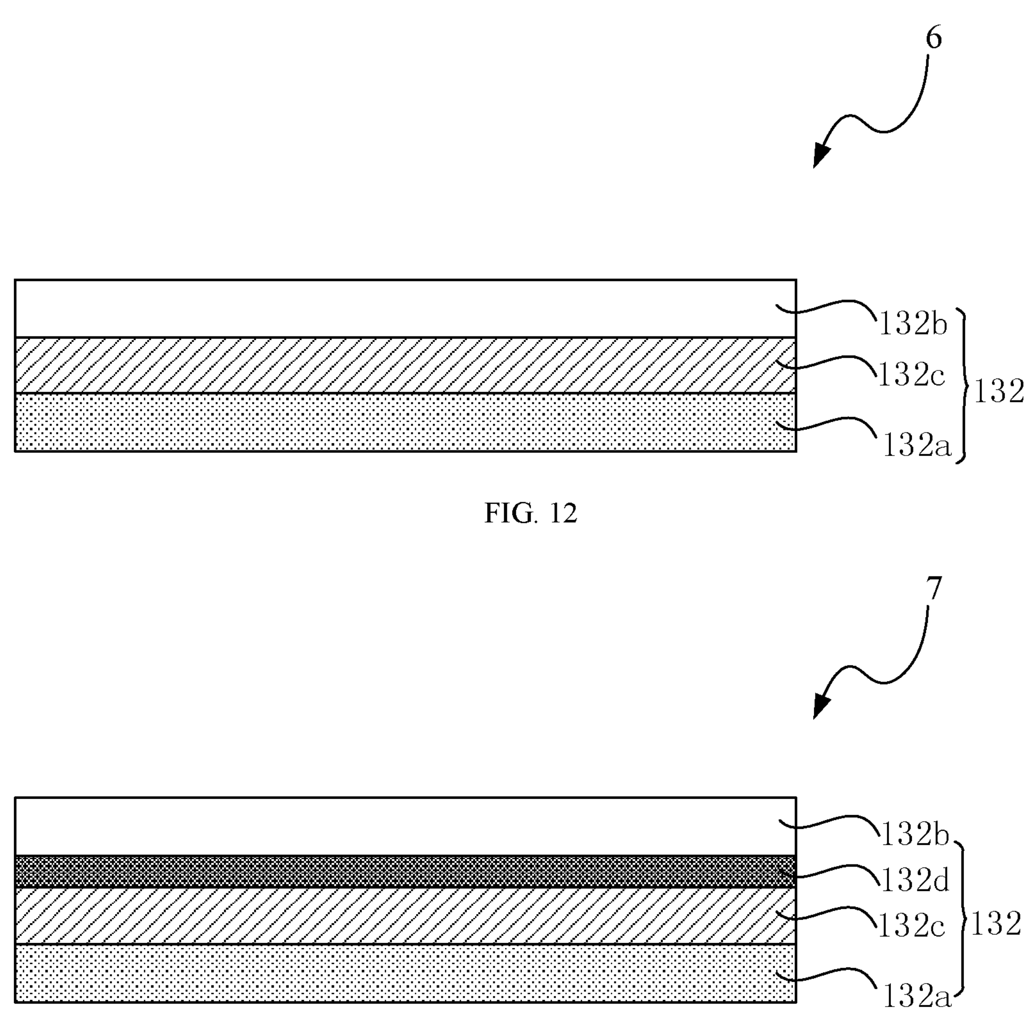
FIG. 12 is a sectional structure diagram of a local area of a multi-wavelength LED structure according to a sixth embodiment of the present disclosure.
FIG. 13 is a sectional structure diagram of a local area of a multi-wavelength LED structure according to a seventh embodiment of the present disclosure.

FIG. 12 is a sectional structure diagram of a local area of a multi-wavelength LED structure according to a sixth embodiment of the present disclosure. As shown in FIG. 12, the multi-wavelength LED structure 6 and the manufacturing method thereof according to the sixth embodiment are roughly the same as the multi-wavelength LED structures 4 and the manufacturing methods thereof according to the fourth embodiment, except that the first semiconductor layer 11 has a conductivity type of N type, the second semiconductor layer 14 has a conductivity type of P type, and the second quantum well layer 132 further includes a second anti-annihilation layer 132*c*. The second anti-annihilation layer 132*c* is arranged between the second barrier layer 132*a* adjacent to the second quantum well layer 14 and the second well layer 132*b*. The conduction band energy level of the second anti-annihilation layer 132*c* is higher than the conduction band energy level of the second barrier layer 132*a*.

The conduction band energy level of the second anti-annihilation layer 132*c* is higher than the conduction band energy level of the second barrier layer 132*a*, which can reduce the probability of the electrons penetrating the last second barrier layer 132*a* on the electron transition path, thus improving the probability of the electrons recombining in the second quantum well layer 132, and improving the light-emitting efficiency of the second quantum well layer 132.

The material of the second anti-annihilation layer 132*c* can include AlGaN, which can be doped with P-type ions, or not be doped.

In other embodiments, the conductive type of the first semiconductor layer 11 can be P-type, and the conductive type of the second semiconductor layer 14 can be N-type. The second anti-annihilation layer 132*c* is arranged between the second barrier layer 132*a* adjacent to the first quantum well layer 131 and the second well layer 132*b*. The conduction band energy level of the second anti-annihilation layer 132*c* is higher than the conduction band energy level of the second barrier layer 132*a*. The second anti-annihilation layer 132*c* can reduce the probability of the electrons penetrating the last second barrier layer 132*a* on the electron transition path, thus improving the probability of the electrons recombining in the second quantum well layer 132, and improving the light-emitting efficiency of the second quantum well layer 132.

Similar to FIG. 7 and FIG. 9, the second anti-annihilation layer 132*c* contacts the second well layer 132*b*, and the second anti-annihilation layer 132*c* contains Al element. From the second barrier layer 132*a* to the second well layer 132*b*, the proportion of the amount of Al in the second anti-annihilation layer 132*c* continuously increases or increases in a stepwise manner.

FIG. 13 is a sectional structure diagram of a local area of a multi-wavelength LED structure according to a seventh embodiment of the present disclosure. Referring to FIG. 13, the multi-wavelength LED structure 7 and the manufacturing method thereof according to the seventh embodiment are roughly the same as the multi-wavelength LED structure 6 and the manufacturing method thereof according to the sixth embodiment, except that there is a second interlayer 132*d* between the second anti-annihilation layer 132*c* and the second well layer 132*b*. The proportion of the amount of Al in the second interlayer 132*d* is smaller than the proportion of the amount of Al in the second anti-annihilation layer 132*c*.

A material of the second interlayer 132*d* may be AlGaN. The thickness of the second interlayer 132*d* on the top wall can be in the order of magnitude of nanometers.

Figure 14:
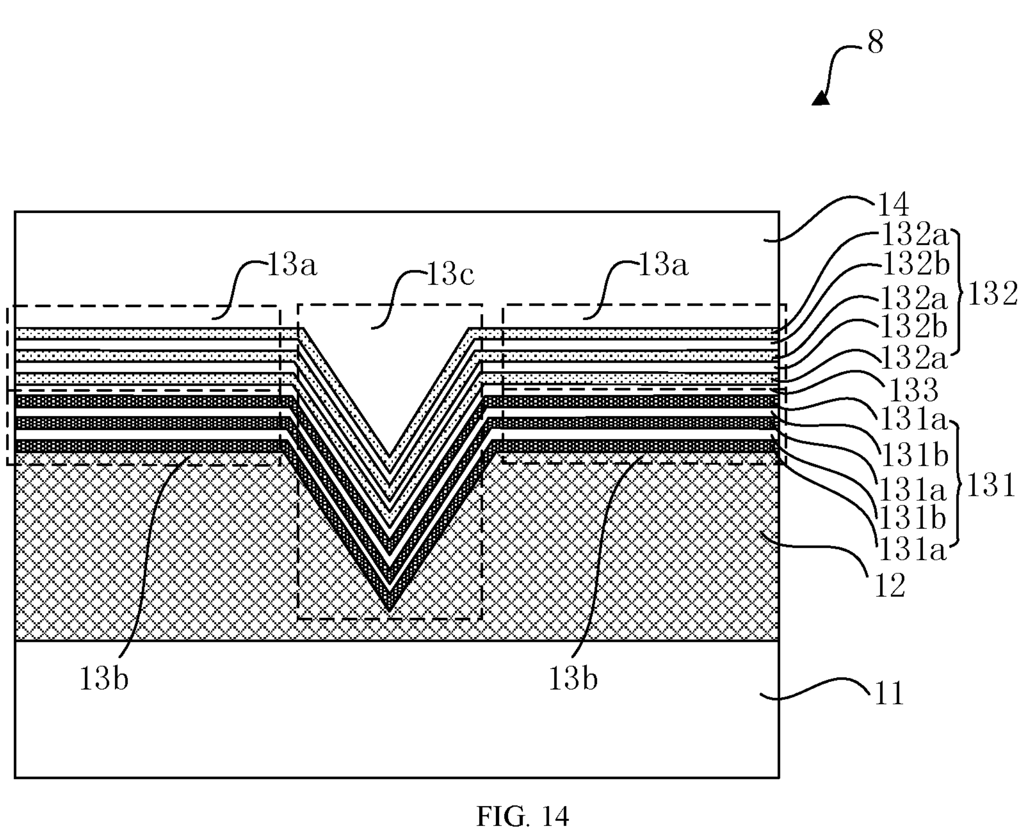
FIG. 14 is a sectional structure diagram of a multi-wavelength LED structure according to an eighth embodiment of the present disclosure.

FIG. 14 is a sectional structure diagram of a multi-wavelength LED structure according to an eighth embodiment of the present disclosure. As shown in FIG. 14, the multi-wavelength LED structure 8 and the manufacturing method thereof according to the eighth embodiment are roughly the same as the multi-wavelength LED structures 1, 2, 3, 4, 5, 6, 7 and manufacturing methods thereof according to the first to seventh embodiments, except that the conductive type of the first semiconductor layer 11 is N-type, the conductive type of the second semiconductor layer 14 is P-type, and a third anti-annihilation layer 133 is provided between the first quantum well layer 131 and the second quantum well layer 132, the conduction band energy level of the third anti-annihilation layer 133 is higher than the conduction band energy level of the second barrier layer 132*a*. The third anti-annihilation layer 133 can reduce the probability of the electrons penetrating the second barrier layer 132*a* on the electron transition path, thus improving the probability of the electrons recombining in the first quantum well layer 131, and improving the light-emitting efficiency of the first quantum well layer 131. The proportion of the amount of Al in the third anti-annihilation layer 133 is greater than the proportion of the amount of Al in the second barrier layer 132*a*.

In other embodiments, the conduction type of the first semiconductor layer 11 is P-type, the conduction type of the second semiconductor layer 14 is N-type, the third anti-annihilation layer 133 is provided between the first quantum well layer 131 and the second quantum well layer 132, and the conduction band energy level of the third anti-annihilation layer 133 is higher than the conduction band energy level of the first barrier layer 131*a*. The third anti-annihilation layer 133 can reduce the probability of the electrons penetrating the first barrier layer 131*a* on the electron transition path, thus improving the probability of the electrons recombining in the second quantum well layer 132, and improving the light-emitting efficiency of the second quantum well layer 132. The proportion of the amount of Al in the third anti-annihilation layer 133 is greater than the proportion of the amount of Al in the first barrier layer 131*a*.

Compared with the prior art, the present disclosure has the following beneficial effects:

1) The thickness of the quantum well layer epitaxially grown on the side wall of the V-shaped pit is less than the thickness of the quantum well layer grown on the top wall. The thickness of the quantum well layer is smaller, correspondingly the band gap width is larger, the emitting-light wavelength is shorter, and the carrier is easier to penetrate, which can improve the light-emitting efficiency of the quantum well layer near the N-type semiconductor layer. Therefore, the first quantum well layer and the second quantum well layer are successively epitaxially grown on the side wall of the V-shaped pit and the top wall of the stress release layer. The second quantum well layer located on the top wall of the stress release layer is the first light-emitting region, the first quantum well layer located on the top wall of the stress release layer is the second light-emitting region, and the first quantum well layer or the second quantum well layer located on the side wall of the V-shaped pit is the third light-emitting region; the emitting-light wavelengths of electron-hole pairs recombination in the first light-emitting region, recombination in the second light-emitting region, and recombination in the third light-emitting region through the side wall of the V-shaped pit can correspond to different colors. The advantages are: avoiding the use of complex driving circuits, long life, high reliability, and at the same time, good color rendering and freely adjusting the emitting-light wavelength.
2) In the alternative embodiment, the conductivity type of the first semiconductor layer is N-type, and the conductivity type of the second semiconductor layer is P-type. The second quantum well layer includes the second well layer, the second barrier layers on both sides of the second well layer, and the second anti-annihilation layer between the second barrier layer adjacent to the second semiconductor layer and the second well layer. The conduction band energy level of the second anti-annihilation layer is higher than the conduction band energy level of the second barrier layer; and/or the first quantum well layer includes the first well layer, the first barrier layers on both sides of the first well layer, and the first anti-annihilation layer between the first barrier layer adjacent to the second quantum well layer and the first well layer. The conduction band energy level of the first anti-annihilation layer is higher than the conduction band energy level of the first barrier layer. The first anti-annihilation layer can improve the light-emitting efficiency of the first quantum well layer, and the second anti-annihilation layer can improve the light-emitting efficiency of the second quantum well layer.

Although the present disclosure is disclosed as above, the present disclosure is not limited thereto. Any person skilled in the art can make various changes and modifications without departing from the spirit and scope of the present disclosure, and therefore the scope of protection of the present disclosure shall be subject to the scope defined by the claims.

The invention claimed is:

1. A multi-wavelength LED structure, comprising:

a first semiconductor layer;

a stress release layer located on the first semiconductor layer, wherein the stress release layer is provided with a V-shaped pit, wherein the V-shaped pit penetrates part of a thickness of the stress release layer;

a first quantum well layer and a second quantum well layer stacked from bottom to top on a side wall of the V-shaped pit and a top wall of the stress release layer; wherein the second quantum well layer located on the top wall of the stress release layer is a first light-emitting region, the first quantum well layer located on the top wall of the stress release layer is a second light-emitting region, and the first quantum well layer or the second quantum well layer located on the side wall of the V-shaped pit is a third light-emitting region; and a second semiconductor layer located on the second quantum well layer, wherein a conductive type of the second semiconductor layer is opposite to a conductive type of the first semiconductor layer; if electron-hole pairs of the second semiconductor layer and the first semiconductor layer recombine in the first light-emitting region, light corresponding to a first light-emitting wavelength emits; if electron-hole pairs of the second semiconductor layer and the first semiconductor layer recombine in the second light-emitting region, light corresponding to a second light-emitting wavelength emits; if electronic-hole pairs of the second semiconductor layer and the first semiconductor layer recombine in the third light-emitting region through the side wall of the V-shaped pit, light corresponding to a third light-emitting wavelength emits; and the first light-emitting wavelength, the second light-emitting wavelength and the third light-emitting wavelength correspond to different colors of lights;

wherein a conductivity type of the first semiconductor layer is N-type, and a conductivity type of the second semiconductor layer is P-type, and the second quantum well layer comprises a second well layer, second barrier layers arranged on both sides of the second well layer, and a second anti-annihilation layer arranged between the second barrier layer adjacent to the second semiconductor layer and the second well layer, and a conduction band energy level of the second anti-annihilation layer is higher than a conduction band energy level of the second barrier layer, and/or the first quantum well layer comprises a first well layer, first barrier layers arranged on both sides of the first well layer, and a first anti-annihilation layer arranged between the first barrier layer adjacent to the second quantum well layer and the first well layer, and a conduction band energy level of the first anti-annihilation layer is higher than a conduction band energy level of the first barrier layer; or a conductivity type of the first semiconductor layer is P-type, and a conductivity type of the second semiconductor layer is N-type, and the first quantum well layer comprises a first well layer, first barrier layers arranged on both sides of the first well layer, and a first anti-annihilation layer arranged between the first barrier layer adjacent to the stress release layer and the first well layer, and a conduction band energy level of the first anti-annihilation layer is higher than a conduction band energy level of the first barrier layer, and/or the second quantum well layer comprises a second well layer, second barrier layers arranged on both sides of the second well layer, and a second anti-annihilation layer arranged between the second barrier layer adjacent to the first quantum well layer and the second well layer, and a conduction band energy level of the second anti-annihilation layer is higher than a conduction band energy level of the second barrier layer;

wherein a first interlayer is arranged between the first anti-annihilation layer and the first well layer, and a proportion of an amount of Al element in the first interlayer is less than a proportion of an amount of Al element in the first anti-annihilation layer; and a second interlayer is arranged between the second anti-annihilation layer and the second well layer, and a proportion of an amount of Al element in the second interlayer is less than a proportion of an amount of Al element in the second anti-annihilation layer.

2. The multi-wavelength LED structure according to claim 1, wherein a third anti-annihilation layer is arranged between the first quantum well layer and the second quantum well layer, and a conduction band energy level of the third anti-annihilation layer is higher than a conduction band energy level of the second barrier layer.

3. The multi-wavelength LED structure according to claim 1, wherein a third anti-annihilation layer is arranged between the first quantum well layer and the second quantum well layer, and a conduction band energy level of the third anti-annihilation layer is higher than a conduction band energy level of the first barrier layer.

4. The multi-wavelength LED structure according to claim 1, wherein the first anti-annihilation layer contains Al element, and from the first barrier layer adjacent to the second quantum well layer to the first well layer, a proportion of an amount of Al element in the first anti-annihilation layer gradually increases; or the second anti-annihilation layer contains Al element, and from the second barrier layer adjacent to the second semiconductor layer to the second well layer, a proportion of an amount of Al element in the second anti-annihilation layer gradually increases.

5. The multi-wavelength LED structure according to claim 4, wherein from the first barrier layer adjacent to the second quantum well layer to the first well layer, the proportion of the amount of Al element in the first anti-annihilation layer continuously increases or increases stepwise; or from the second barrier layer adjacent to the second semiconductor layer to the second well layer, the proportion of the amount of Al element in the second anti-annihilation layer continuously increases or increases stepwise.

6. The multi-wavelength LED structure according to claim 1, wherein at least one of the first anti-annihilation layer is doped with P-type ions; or the second anti-annihilation layer is doped with P-type ions.

7. A manufacturing method of the multi-wavelength LED structure according to claim 1, comprising:

epitaxially growing the stress release layer on the first semiconductor layer, wherein the stress release layer is provided with the V-shaped pit;

successively epitaxially growing the first quantum well layer and the second quantum well layer on the side wall of the V-shaped pit and the top wall of the stress release layer; wherein the second quantum well layer located on the top wall of the stress release layer is the first light-emitting region, the first quantum well layer located on the top wall of the stress release layer is the second light-emitting region, and the first quantum well layer or the second quantum well layer located on the side wall of the V-shaped pit is the third light-emitting region; and epitaxially growing the second semiconductor layer on the second quantum well layer, wherein the conductive type of the second semiconductor layer is opposite to the conductive type of the first semiconductor layer; if electron-hole pairs of the second semiconductor layer and the first semiconductor layer recombine in the first light-emitting region, light corresponding to the first light-emitting wavelength emits; if electron-hole pairs of the second semiconductor layer and the first semiconductor layer recombine in the second light-emitting region, light corresponding to the second light-emitting wavelength emits; if electronic-hole pairs of the second semiconductor layer and the first semiconductor layer recombine in the third light-emitting region through the side wall of the V-shaped pit, light corresponding to the third light-emitting wavelength emits; and the first light-emitting wavelength, the second light-emitting wavelength and the third light-emitting wavelength correspond to different colors of lights;

wherein the conductivity type of the first semiconductor layer is N-type, and the conductivity type of the second semiconductor layer is P-type; and the second quantum well layer comprises the second well layer, second barrier layers arranged on both sides of the second well layer, and the second anti-annihilation layer arranged between the second barrier layer adjacent to the second semiconductor layer and the second well layer, and the conduction band energy level of the second anti-annihilation layer is higher than the conduction band energy level of the second barrier layer, and/or the first quantum well layer comprises the first well layer, first barrier layers arranged on both sides of the first well layer, and the first anti-annihilation layer arranged between the first barrier layer adjacent to the second quantum well layer and the first well layer, and the conduction band energy level of the first anti-annihilation layer is higher than the conduction band energy level of the first barrier layer; or the conductivity type of the first semiconductor layer is P-type, and the conductivity type of the second semiconductor layer is N-type; and the first quantum well layer comprises the first well layer, first barrier layers arranged on both sides of the first well layer, and the first anti-annihilation layer arranged between the first barrier layer adjacent to the stress release layer and the first well layer, and the conduction band energy level of the first anti-annihilation layer is higher than the conduction band energy level of the first barrier layer, and/or the second quantum well layer comprises the second well layer, second barrier layers arranged on both sides of the second well layer, and the second anti-annihilation layer arranged between the second barrier layer adjacent to the first quantum well layer and the second well layer, and the conduction band energy level of the second anti-annihilation layer is higher than the conduction band energy level of the second barrier layer;

wherein a first interlayer is arranged between the first anti-annihilation layer and the first well layer, and a proportion of an amount of Al element in the first interlayer is less than a proportion of an amount of Al element in the first anti-annihilation layer; and a second interlayer is arranged between the second anti-annihilation layer and the second well layer, and a proportion of an amount of Al element in the second interlayer is less than a proportion of an amount of Al element in the second anti-annihilation layer.

8. The manufacturing method of the multi-wavelength LED structure according to claim 7, wherein the V-shaped pit is formed during a process of epitaxially growing the stress release layer, or the V-shaped pit is formed by etching the stress release layer.

9. The manufacturing method of the multi-wavelength LED structure according to claim 7, wherein a third anti-annihilation layer is arranged between the first quantum well layer and the second quantum well layer, and a conduction band energy level of the third anti-annihilation layer is higher than the conduction band energy level of the second barrier layer.

10. The manufacturing method of the multi-wavelength LED structure according to claim 7, wherein a third anti-annihilation layer is arranged between the first quantum well layer and the second quantum well layer, and a conduction band energy level of the third anti-annihilation layer is higher than the conduction band energy level of the first barrier layer.

11. The manufacturing method of the multi-wavelength LED structure according to claim 7, wherein the first anti-annihilation layer contains Al element, and from the first barrier layer adjacent to the second quantum well layer to the first well layer, a proportion of an amount of Al element in the first anti-annihilation layer gradually increases; or the second anti-annihilation layer contains Al element, and from the second barrier layer adjacent to the second semiconductor layer to the second well layer, a proportion of an amount of Al element in the second anti-annihilation layer gradually increases.

12. The manufacturing method of the multi-wavelength LED structure according to claim 11, wherein from the first barrier layer adjacent to the second quantum well layer to the first well layer, the proportion of the amount of Al element in the first anti-annihilation layer continuously increases or increases stepwise; or from the second barrier layer adjacent to the second semiconductor layer to the second well layer, the proportion of the amount of Al element in the second anti-annihilation layer continuously increases or increases stepwise.

* * * * *